United States Patent [19]

Asano

[11] Patent Number: 4,806,984
[45] Date of Patent: Feb. 21, 1989

[54] COLOR-TONE CONTROLLING METHOD AND APPARATUS THEREFOR

[75] Inventor: Yuji Asano, Nagoya, Japan
[73] Assignee: Brother Kogyo Kabushiki Kaisha, Japan
[21] Appl. No.: 154,235
[22] Filed: Feb. 10, 1988
[30] Foreign Application Priority Data Feb. 13, 1987 [JP] Japan .................. 62-32085

[51] Int. Cl.⁴ .............. G03B 27/32; G03B 27/52
[52] U.S. Cl. .................................. 355/32; 355/77
[58] Field of Search ............ 355/32, 35, 77, 27; 430/138; 354/297, 301–304, 319

[56] References Cited

U.S. PATENT DOCUMENTS 4,626,097 12/1986 Uchida ................ 355/32 X
4,748,475 5/1988 Ishiyama et al. ........ 355/32 X
4,772,922 9/1988 Kawahara et al. ....... 355/32

*Primary Examiner*—Richard A. Wintercorn
*Attorney, Agent, or Firm*—Kane, Dalsimer, Sullivan, Kurucz, Levy, Eisele and Richard

[57] ABSTRACT

Disclosed is a color-tone controlling method and apparatus therefor, in which a desirably selected one of a plurality of color-tone plates of various colors such as red, green, blue, and so on is put onto a back surface of a color photosensitive medium, so that when a front surface of the color photosensitive medium is exposed to image carrying light, a part of light transmitted through the color photosensitive medium of the same color as that of the color-tone plate is reflected on the color-tone plate so as to re-expose the back surface of the color photosensitive medium.

6 Claims, 2 Drawing Sheets

COLOR-TONE CONTROLLING METHOD AND APPARATUS THEREFOR

BACKGROUND OF THE INVENTION

1. Field of the Invention

The present invention relates to a color copying machine or the like, and particularly relates to a method and apparatus for controlling color-tone of a duplicated picture in a color copying machine or the like.

2. Description of the Prior Art

For example, in conventionally generally known color-copying machines for ordinary paper, an image of color toners of cyan, magenta, and yellow is transferred onto ordinary paper so as to obtain a color duplicated picture by the mixture of the color toners. In that case, if, for example, a halogen lamp or the like is used as a light source for scanning a surface of an original, the color duplicated material will be less colored with cyan while intensive in red tone, because the light source has a large quantity of light in red component. Alternatively, for example, if a fluorescent lamp or the like having a large quantity of light in blue component is used as a light source, the color duplicated material will be less colored with yellow while intensive in blue tone. Even in the case where the quantity of light emitted from the light source is equal in tone among red, green, and blue components, the reflection factor or transmission factor of an original varies depending on the color of light, for example 70% for red, 20% for green, and 30~40% for blue, so that the color duplicated matter becomes unbalanced in color tone, resulting in a problem in color reproducibility.

Recently, a color generating photosensitive medium (hereinafter simply referred to as "a color photosensitive medium") has been known as disclosed, for example, in Japanese Patent Unexamined Publication No. 58-88739. The color photosensitive medium is arranged such that coloring materials of cyan, magenta, and yellow are separately microcapsulized together with photo-setting resin, a photo-intensifier, a photopolymerization initiator, and so on, and the thus prepared microcapsules are mixed with a developer which will cause a developing reaction with the coloring materials in the microcapsules, and the mixture is applied to a surface of a support. When the thus prepared color photosensitive medium is used as a copying sheet of the above-mentioned color copying machine, a duplicated picture is obtained in the following manner. The color photosensitive medium is subject to exposure processing in a predetermined manner such that the cyanic coloring microcapsules on the color photosensitive medium are photo-set at the portion corresponding to the red region on an original, yellow coloring microcapsules are photo-set at the portion corresponding to the blue region on the original, and magenta coloring microcapsules are photo-set at the portion corresponding to the green region on the original. The exposed color photosensitive medium is then pressed by pressing rollers so that the not-set microcapsules on the color photosensitive medium are broken. Thus, a coloring reaction is caused between the coloring materials in the broken microcapsules and the developer such that a red color which is a mixture of magenta and yellow colors is reproduced in the portion corresponding to the red region of the original, a blue color which is a mixture of cyanic and magenta colors is reproduced in the portion corresponding to the blue region of the original, a green color which is a mixture of cyanic and yellow colors is reproduced in the portion corresponding to the green region of the original. Thus, a duplicated picture having colors corresponding to those of the original is obtained. Thus, unlike the conventional case employing means for transferring coloring toners onto an ordinary sheet, the above-mentioned color photosensitive medium is advantageous in that a duplicated picture superior in resolution as well as in clearness can be obtained and the maintenance of the apparatus is easy because no toner is used.

However, even in the case where such a color photosensitive medium is used as a copying sheet, the problem that the color tone of the duplicated picture is made different from that of the original still exists similarly to the case of the color duplication on the conventional PPC, and therefore the problem in color reproducibility is left as it is.

SUMMARY OF THE INVENTION

It is therefore an object of the present invention to solve the problems described above in the prior art.

It is another object of the present invention to provide a color-tone controlling method and apparatus therefor in which the color reproducibility is improved while maintaining the superior resolution and clearness in duplicated pictures which are a feature of a color photosensitive medium.

In order to attain the above objects, according to an aspect of the present invention, the color-tone controlling method comprises the steps of: preparing a plurality of color-tone plates of various colors such as red, green, blue, and so on; putting a desirably selected one of the color-tone plates onto a back surface of a color photosensitive medium; and exposing a front surface of the color photosensitive medium to image carrying light so that a part of light transmitted through the color photosensitive medium of the same color as that of the color-tone plate is reflected on the color-tone plate so as to impinge onto the color photosensitive medium.

According to another aspect of the present invention, the color-tone controlling apparatus comprises an exposure light source, an original image, a color photosensitive medium, a focusing lens means disposed so as to focus the light emitted from the exposure light source and carrying the original image onto a front surface of the color photosensitive medium, and a desirably selected one of color-tone plates of various colors such as red, green, blue, and so on, changeably disposed on a back surface of the color photosensitive medium, so that when a front surface of the color photosensitive medium is exposed to the image carrying light a part of light transmitted through the color photosensitive medium of the same color as that of the color-tone plate is reflected on the color-tone plate so as to re-expose the back surface of the color photosensitive medium.

BRIEF DESCRIPTION OF THE DRAWINGS

Other features and advantages of the present invention will be apparent from the following description taken in connection with the accompanying drawings, wherein.

DETAILED DESCRIPTION OF PREFERRED EMBODIMENTS

Figure 1:
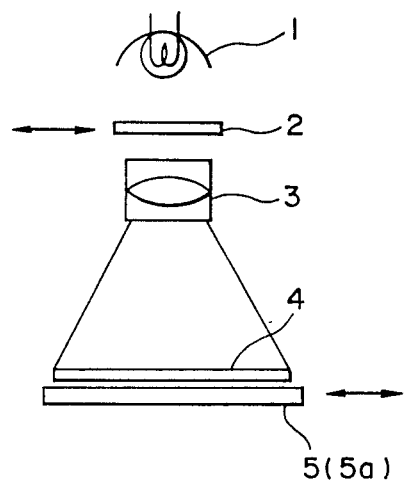
FIG. 1 is a schematic view showing the arrangement of an apparatus for realizing the method according to the present invention.

FIG. 1 is a schematic view showing an arrangement of the copying apparatus (hard copy machine) for realizing the color-tone controlling method according to the present invention. The apparatus is provided with an exposure light source 1 such as a halogen lamp, a slidably-mounted transparent film original form 2, a focusing lens 3, and a color photosensitive medium 4. A desired color-tone plate 5 selected form various color-tone plates for red, green, blue, and so on, is disposed on the lower surface of the color photosensitive medium 4, and then the color photosensitive medium 4 is subject to exposure processing with light from the exposure light source 1.

In the embodiment, the quantity of light of the exposure light source 1 is large in its red component because a halogen lamp is used as the exposure light source 1. In such a case, a cyanic tone plate 5a is selected as the color-tone plate 5 and put on the back surface of the color photosensitive medium 4. If the light emitted from the exposure light source 1 impinged on the surface of the color photo-sensitive medium 4 through the transparent film original form 2 and the focusing lens 3 without the use of the cyanic color-tone plate 5a, the cyanic coloring microcapsules on the color photosensitive medium 4 would be more intensively exposed than other coloring microcapsules because the quantity of light of the source lamp 1 is large in its red component. Accordingly, more of the magenta and yellow coloring microcapsules would be left in a not-set state so that the duplicated picture became more intensive in red color. In the embodiment of the invention, however, there is provided the cyanic color-tone plate 5a so that only the cyanic component of the light transmitted through the color photosensitive medium 4 is reflected on the cyanic color-tone plate 5a so as to re-expose the color photosensitive medium 4 again from the back surface thereof. By the reflection of the cyanic light, the magenta and yellow coloring microcapsules are further exposed so that the color photosensitive medium 4 can be subject to equal exposure processing as if the color photosensitive medium 4 is exposed to the exposure source light having equal quantity of light in its red, green and blue components.

The color photosensitive medium 4 which has been subject to exposure processing is then developed in the next pressure-developing step by not shown pressure rollers. However, this pressure-developing step is known and therefore the description is omitted here.

Figure 1A:
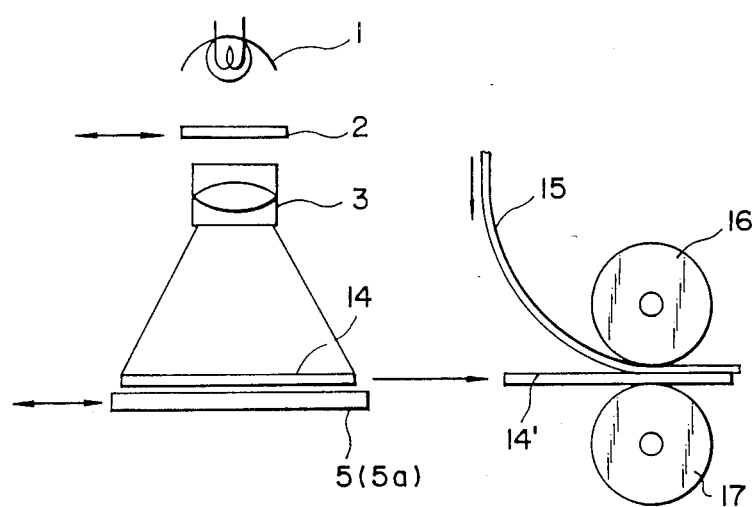
FIG. 1A is a schematic view for explaining the exposure and development apparatus for a color photosensitive medium of the separation type.

Although FIG. 1 illustrates an embodiment where a color photosensitive medium of the integrated type in which microcapsules and a developer are applied on one and the sheet is used by way of example. The present invention, however, is not limited to the above embodiment, but is applicable to a case where a color photosensitive medium of the separation type on which only microcapsules are applied on a sheet is used together with a separately prepared developing sheet carrying a developer coated thereon. FIG. 1A shows another embodiment in which such a color photosensitive medium of the separation type is used together with a separately prepared developing sheet. In FIG. 1A, parts the same as those in FIG. 1 are correspondingly referenced. As shown in FIG. 1A, a photosensitive sheet 14 is exposed to image carrying light through an exposure system similar to that of FIG. 1 to thereby form a latent image thereon. The photosensitive sheet 14' carrying such a latent image is put on a developing sheet 15 and the stack of sheets 14' and 15 are passed between pressure rollers 16 and 17 so as to carry out pressure-development. The color-tone plate 5 functions in the same manner as in the embodiment of FIG. 1.

Figure 2:
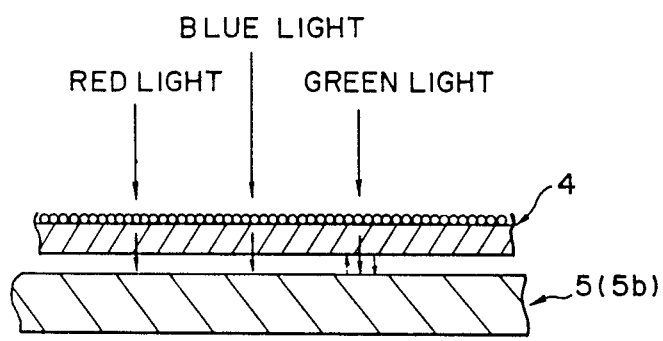
FIG. 2 is an enlarged explanatory view showing a main portion of another embodiment.

As a further embodiment, assume now that the color photosensitive medium 4 is exposed to the source light having the quantity of light equal in its red, green and blue color components, and that it is desired to obtain a duplicated picture which is intensive, for example, in its green tone. In this case, a green color-tone plate 5b is put on the lower surface of the color photosensitive medium 4 as shown in FIG. 2. Then, only the green component of the light transmitted through the color photosensitive medium 4 is reflected on the green color-tone plate 5b to impinge on the color photosensitive medium 4 from its lower surface to thereby further photo-set only the magenta coloring microcapsules on the color photosensitive medium 4, so that more of the cyanic and yellow coloring microcapsules are left in a not-set state. Accordingly, the resultant duplicated picture is intensive in green tone.

As described above, according to the present invention, the color-tone of the duplicated picture can be easily adjusted and desired color-tone can be suitably selected by properly selecting the color-tone plate to be put on the back surface of the color photosensitive medium. Further, the resultant color duplicated picture is superior in resolution as well as in clearness owing to the advantageous feature of the color photosensitive medium. Accordingly, it is very useful to apply the invention to a color copying machine or the like.

What is claimed is:

1. In a system for making a color duplicate by exposing a color photosensitive medium to light carrying an original image, a color-tone controlling method comprising the steps of:
   preparing a plurality of color-tone plates of various colors such as red, green, blue, and so on;
   putting a desirably selected one of said color-tone plates onto a back surface of said color photosensitive medium; and
   exposing a front surface of said color photosensitive medium to said original image carrying light, a part of light transmitted through said color photosensitive medium of the same color as that of said color-tone plate being reflected on said color-tone plates so as to re-expose said color photosensitive medium.

2. A color-tone controlling method according to claim 1, in which said color photosensitive medium is provided with a mixture of a developer and coloring microcapsules applied thereon, said microcapsules separately containing coloring materials of cyan, magenta, and yellow together with photo-setting resin, and a photo-polymerization initiator.

3. A color-tone controlling method according to claim 1, in which said color photosensitive medium is provided with coloring microcapsules applied thereon, said microcapsules separately containing coloring materials of cyan, magenta, and yellow together with photo-setting resin, and a photo-polymerization initiator, said color photosensitive medium being used together with a separately prepared developing medium provided with a developer applied thereon sheet when said color photosensitive medium is developed.

4. In a system for making a color duplicate by exposing a color photosensitive medium to light carrying an image of a picture, a color-tone controlling apparatus comprising:
- an exposure light source for exposing said color photosensitive medium to light carrying an original image; and
- a desirably selected one of color-tone plates of various colors such as red, green, blue, and so on, changeably disposed on a back surface of said color photosensitive medium, so that when a front surface of said color photosensitive medium is exposed to said image carrying light a part of light transmitted through said color photosensitive medium of the same color as that of said color-tone plate is reflected on said color-tone plate so as to re-expose said back surface of said color photosensitive medium.

5. A color-tone controlling apparatus according to claim 3, in which said color photosensitive medium is provided with a mixture of a developer and coloring microcapsules applied thereon, said microcapsules separately containing coloring materials of cyan, magenta, and yellow together with photo-setting resin, and a photo-polymerization initiator.

6. A color-tone controlling method according to claim 1, in which said color photosensitive medium is provided with coloring microcapsules applied thereon, said microcapsules separately containing coloring materials of cyan, magenta, and yellow together with photo-setting resin, and a photo-polymerization initiator, said color photosensitive medium being used together with a separately prepared developing medium provided with a developer applied thereon sheet when said color photosensitive medium is developed.

* * * * *